United States Patent
Sauvageot et al.

(10) Patent No.: US 12,421,408 B2
(45) Date of Patent: Sep. 23, 2025

(54) INKJET INK FOR PRINTED CIRCUIT BOARDS

(71) Applicant: AGFA-GEVAERT NV, Mortsel (BE)

(72) Inventors: Marion Sauvageot, Mortsel (BE); Ann Willems, Mortsel (BE); Johan Loccufier, Mortsel (BE)

(73) Assignee: Agfa-Gevaert NV, Mortsel (BE)

( * ) Notice: Subject to any disclaimer, the term of this patent is extended or adjusted under 35 U.S.C. 154(b) by 413 days.

(21) Appl. No.: 17/924,520

(22) PCT Filed: Apr. 27, 2021

(86) PCT No.: PCT/EP2021/060901
§ 371 (c)(1),
(2) Date: Nov. 10, 2022

(87) PCT Pub. No.: WO2021/228543
PCT Pub. Date: Nov. 18, 2021

(65) Prior Publication Data
US 2023/0174808 A1    Jun. 8, 2023

(30) Foreign Application Priority Data

May 12, 2020 (EP) .................................. 20174007

(51) Int. Cl.
| C09D 11/38 | (2014.01) |
| B41J 2/01 | (2006.01) |
| B41J 2/21 | (2006.01) |
| C09D 11/101 | (2014.01) |
| H05K 1/02 | (2006.01) |
| H05K 3/28 | (2006.01) |

(52) U.S. Cl.
CPC .............. *C09D 11/38* (2013.01); *B41J 2/01* (2013.01); *C09D 11/101* (2013.01); *H05K 3/287* (2013.01); *B41J 2/2107* (2013.01); *H05K 1/0269* (2013.01); *H05K 2203/013* (2013.01)

(58) Field of Classification Search
CPC ... B41J 2/01; B41J 2/211; B41J 2/1433; B41J 2/17; B41J 2/17593; B41J 2/2107; B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 2/1623; B41J 2202/00; B41J 2202/03; B41J 2/14201; B41J 2/045; B41J 11/0015; B41J 11/002; B41J 2/04581; B41J 2/055; B41J 2/16538; B41J 2002/16502; B41J 29/02; B41J 2/17513; B41J 2/17509; B41J 29/13; B41J 2/17553; B41J 2/1606; B41J 2/1642; B41J 2/1609; B41J 2/164; B41J 2/162; B41J 2/161; B41J 2/19; B41J 15/04; B41M 5/0011; B41M 5/0017; B41M 5/0023; B41M 5/0047; B41M 7/00; B41M 7/0072; B41M 5/52; B41M 5/5218; B41M 5/5227; C09D 11/326; C09D 11/107; C09D 11/03; C09D 11/037; C09D 11/033; C09D 11/36; C09D 11/40; C09D 11/30; C09D 11/38; C09D 11/32; C09D 11/322; C09D 11/324; C09D 11/328; C09D 11/101; C09D 11/102; C09D 11/005; C09D 11/54; C09D 11/52; C09D 11/106
See application file for complete search history.

(56) References Cited

U.S. PATENT DOCUMENTS

| 2011/0000878 | A1* | 1/2011 | Grant ................... | C09D 11/30 |
| | | | | 524/588 |
| 2011/0143047 | A1* | 6/2011 | Kappaun .............. | C09D 11/101 |
| | | | | 524/265 |
| 2018/0206342 | A1* | 7/2018 | Torfs ................... | C09D 11/101 |
| 2019/0144695 | A1* | 5/2019 | Loccufier ............. | C09D 11/101 |
| | | | | 428/209 |
| 2019/0292387 | A1* | 9/2019 | Loccufier ............. | C09D 11/30 |
| 2020/0399492 | A1* | 12/2020 | Loccufier ............. | C09D 11/38 |

FOREIGN PATENT DOCUMENTS

| CN | 101981143 A | 2/2011 |
| CN | 107852825 A | 3/2018 |
| EP | 3119170 A1 | 1/2017 |
| WO | WO 2009/118506 A1 | 10/2009 |
| WO | WO 2017/009097 A1 | 1/2017 |
| WO | WO 2018/001889 A1 | 1/2018 |

OTHER PUBLICATIONS

European Patent Office, International Search Report in International Patent Application No. PCT/EP2021/060901, mailed Jun. 30, 2021, 3 pp.
European Patent Office, Written Opinion in International Patent Application No. PCT/EP2021/060901, mailed Jun. 30, 2021, 5 pp.

* cited by examiner

*Primary Examiner* — Manish S Shah
(74) *Attorney, Agent, or Firm* — Leydig, Voit & Mayer, Ltd.

(57) ABSTRACT

A radiation curable inkjet ink comprising a polymerizable compound, a photoinitiator characterized in that the inkjet ink further comprises a di- or multifunctional alkoxysilane and a monofunctional alkoxysilane functionalized with a group selected from the group consisting of an epoxide and an oxetane.

14 Claims, No Drawings

INKJET INK FOR PRINTED CIRCUIT BOARDS

CROSS-REFERENCE TO RELATED APPLICATIONS

This patent application is the U.S. national phase of copending International Patent Application No. PCT/EP2021/060901, filed Apr. 27, 2021, which claims the benefit of European Patent Application No. 20174007.3, filed May 12, 2020.

TECHNICAL FIELD OF THE INVENTION

The present invention relates to a UV curable ink jet ink for legend printing in PCB manufacturing.

BACKGROUND ART FOR THE INVENTION

The production workflow of printed circuit boards (PCBs) is gradually shifting from the standard workflow towards a digital workflow to reduce the amount of process steps and lowering the cost and the environmental impact, especially for short run productions.

Inkjet printing is a preferred digital manufacturing technology for different steps of the PCB manufacturing process, going from etch resist over solder mask to legend printing. Preferred inkjet inks are UV curable ink jet inks.

Legend printing typically involves printing of text to label components and to provide other useful information, such as serial numbers, on top of a PCB solder mask as one of the last steps in the PCB manufacturing process.

To guarantee sufficient production latitude, legend inks have to adhere well to a variety of substrates and solder masks. For example in flexible PBCs, the legend ink has to adhere well to both solder mask and polyimide based cover layers used to protect the copper circuitry.

To improve the adhesion, so-called adhesion promoters have been added to the inkjet inks. EP-A 3119170 (Agfa Gevaert) discloses radiation curable inkjet inks used in PCB manufacturing comprising a silane compound as adhesion promoter.

In radiation curing technology, there is a shift from mercury bulbs towards LED curing and more specifically towards bathochromic LEDs having an emission around 395 nm. State of the art legend inks thus have to have a high curing sensitivity when cured with a 395 nm LED.

As most of the printed legends are white, yellowing of the legend ink has to be avoided. This requires a delicate balance in the photoinitiator system to avoid a yellow background and further yellowing upon curing.

In the manufacturing of PCBs there is a demand from an ecological point of view to design boards that are substantially halogen free. Therefore, halogen containing additives, including photoinitiators and flame retardants, have to be avoided when formulating the radiation curable ink jet ink.

SUMMARY OF THE INVENTION

It is an object of the invention to provide a radiation curable inkjet ink for a legend printing step in a method of manufacturing a printed circuit board (PCB) that results in an improved adhesion of the cured inkjet ink on various substrates.

The object of the invention is realized by the radiation curable inkjet ink as defined in claim 1.

Further objects of the invention will become apparent from the description hereinafter.

DETAILED DESCRIPTION OF THE INVENTION

Definitions

The term "monofunctional" in e.g. monofunctional polymerizable compound means that the polymerizable compound includes one polymerizable group.

The term "difunctional" in e.g. difunctional polymerizable compound means that the polymerizable compound includes two polymerizable groups.

The term "polyfunctional" in e.g. polyfunctional polymerizable compound means that the polymerizable compound includes more than two polymerizable groups.

The term "alkyl" means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl, etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted alkaryl group is preferably a phenyl or naphthyl group including one, two, three or more $C_1$ to $C_6$-alkyl groups.

Unless otherwise specified a substituted or unsubstituted aralkyl group is preferably a $C_7$ to $C_{20}$-alkyl group including a phenyl group or naphthyl group.

Unless otherwise specified a substituted or unsubstituted aryl group is preferably a phenyl group or naphthyl group Unless otherwise specified a substituted or unsubstituted heteroaryl group is preferably a five- or six-membered ring substituted by one, two or three oxygen atoms, nitrogen atoms, sulphur atoms, selenium atoms or combinations thereof.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms Unless otherwise specified a substituted alkyl group, a substituted alkenyl group, a substituted alkynyl group, a substituted aralkyl group, a substituted alkaryl group, a substituted aryl and a substituted heteroaryl group are preferably substituted by one or more constituents selected from the group consisting of methyl, ethyl, n-propyl, isopropyl, n-butyl, isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —NO₂.

Radiation Curable Inkjet Ink

The radiation curable inkjet ink comprises at least one polymerizable compound and a photoinitiator, characterized in that the inkjet ink further comprises a di- or multifunctional alkoxysilane and a monofunctional alkoxysilane functionalized with a group selected from the group consisting of an epoxide and an oxetane.

It has been observed that such a radiation curable inkjet ink has an improved adhesion towards various substrates, especially polyimide based substrates and cover layers, typically used in flexible PCBs. Therefore, the radiation curable inkjet ink is suitable to be used as a legend ink in such flexible PCBs.

The radiation curable inkjet ink may further comprise other ingredients such as an adhesion promoter, a colorant, a polymeric dispersant, a polymerization inhibitor, a flame retardant or a surfactant.

The radiation curable inkjet ink may be cured with any type of radiation but is preferably cured with UV radiation, more preferably with UV radiation from UV LEDs. The radiation curable inkjet ink is thus preferably a UV curable inkjet ink.

For reliable industrial inkjet printing, the viscosity of the radiation curable inkjet ink is preferably no more than 20 mPa·s at 45° C., more preferably between 1 and 18 mPa·s at 45° C., and most preferably between 4 and 14 mPa·s at 45° C., all at a shear rate of 1000 s$^{-1}$.

A preferred jetting temperature is between 10 and 70° C., more preferably between 2° and 55° C., and most preferably between 25 and 50° C.

For good image quality and adhesion, the surface tension of the radiation curable inkjet ink is preferably in the range of 18 to 70 mN/m at 25° C., more preferably in the range of 20 to 40 mN/m at 25° C.

Monofunctional Alkoxysilane Compound

The radiation curable inkjet ink includes a monofunctional alkoxysilane functionalized with a cyclic ether group selected from the group consisting of an epoxide and an oxetane. The cyclic ether is preferably an epoxide.

The monofunctional alkoxysilane includes at least one alkoxy group, more preferably at least two alkoxy groups and most preferably three alkoxy groups.

The alkoxy groups are preferably $C_1$ to $C_4$ alkoxy groups, more preferably methoxy, ethoxy or isopropoxy groups, most preferably methoxy or ethoxy groups.

Typical examples of monofunctional alkoxysilanes functionalized with a cyclic ether group selected from the group consisting of an epoxide and an oxetane are given in Table 1.

TABLE 1

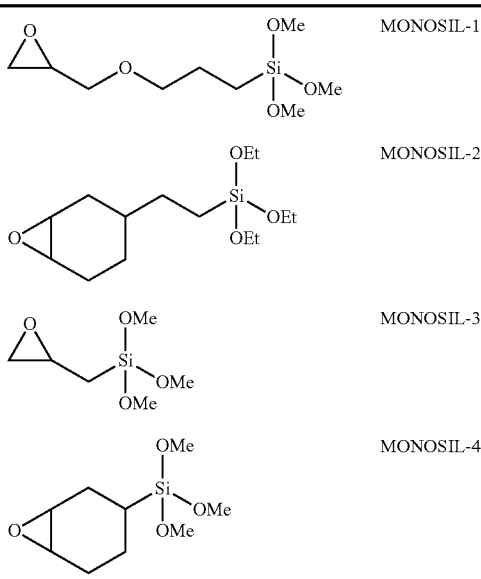

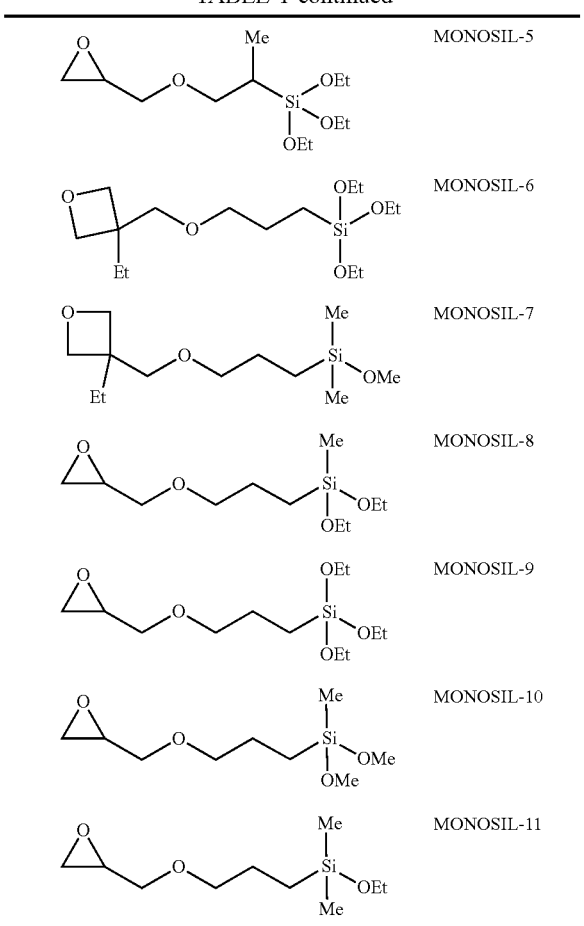

The amount of the monofunctional alkoxysilane compound is preferably between 0.1 and 10 wt %, more preferably between 0.5 and 7.5 wt %, most preferably between 1 and 5 wt %, all relative to the total weight of the inkjet ink.

Di- or Multifunctional Alkoxysilane Compound

The radiation curable inkjet ink includes a di- or multifunctional alkoxysilane compound.

The di- or multifunctional alkoxysilane preferably has at least two alkoxysilane moieties according to Formula I,

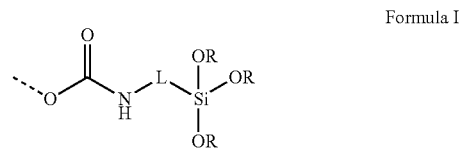

Formula I wherein

L represents a divalent linking group selected from the group consisting of a substituted or unsubstituted alkylene group, a substituted or unsubstituted alkenylene group, a substituted or unsubstituted alkynylene group and a substituted or unsubstituted arylene group;

R represents a group selected from the group consisting of a substituted or unsubstituted alkyl group, a substituted or unsubstituted alkenyl group, a substituted or unsubstituted alkynyl group, a substituted or unsubalkaryl group, a substituted or unsubstituted aralkyl group and a substituted or unsubstituted aryl or heteroaryl group.

L preferably represents a substituted or unsubstituted alkylene group, more preferably an unsubstituted alkylene group, most preferably a propylene group.

R preferably represents a substituted or unsubstituted alkyl group, more preferably an unsubstituted alkyl group, most preferably a C1 to C6 alkyl group, particularly preferred a methyl or an ethyl group.

Typical examples of di- or multifunctional alkoxysilanes are given in Table 2.

TABLE 2

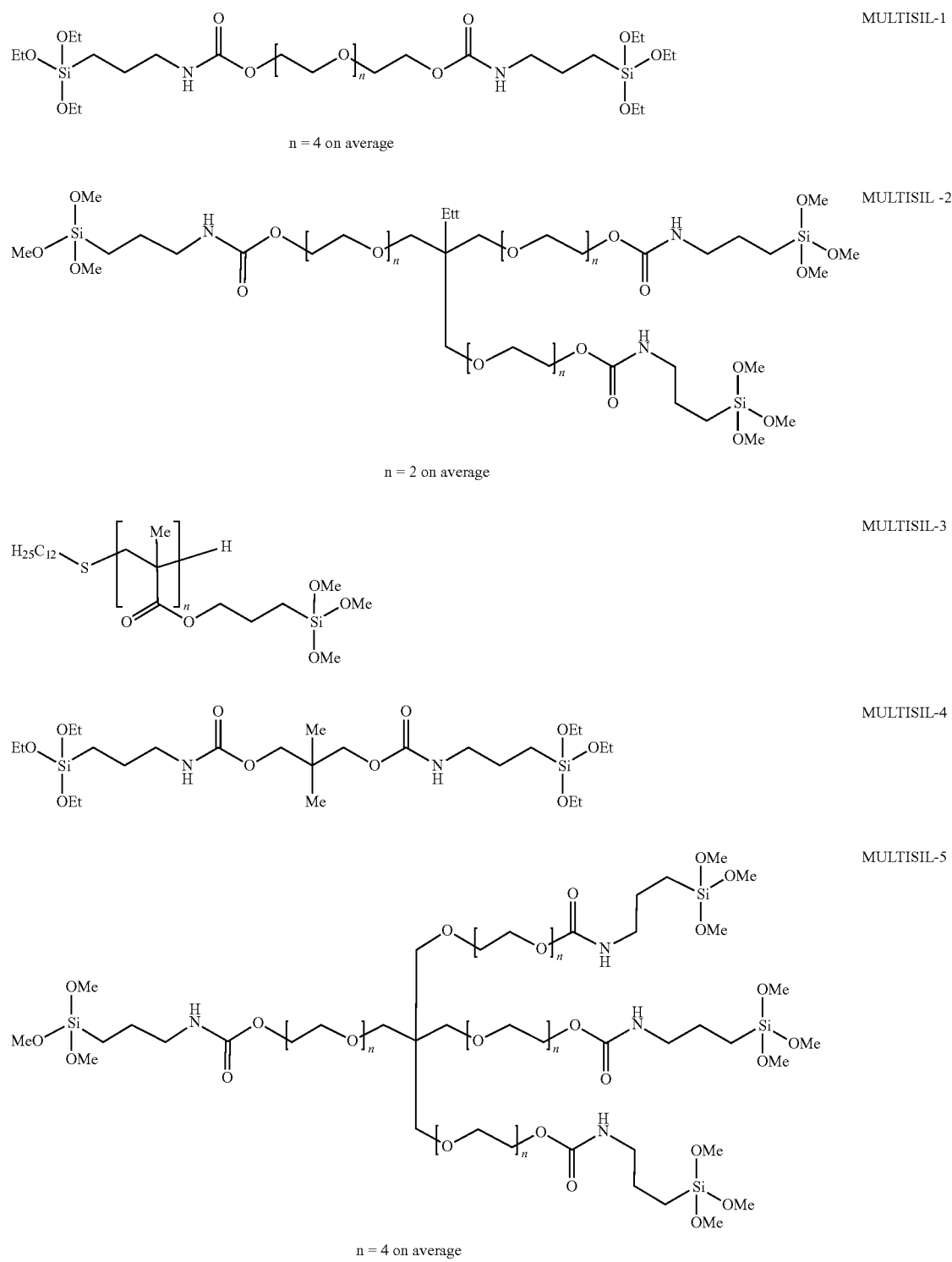

TABLE 2-continued

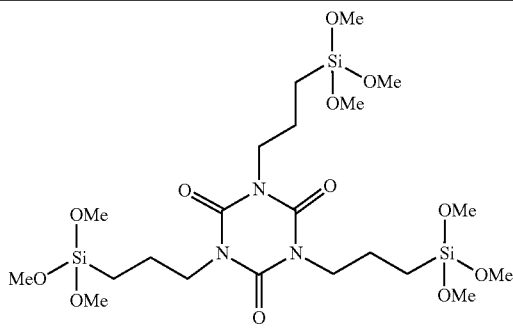
MULTISIL-6

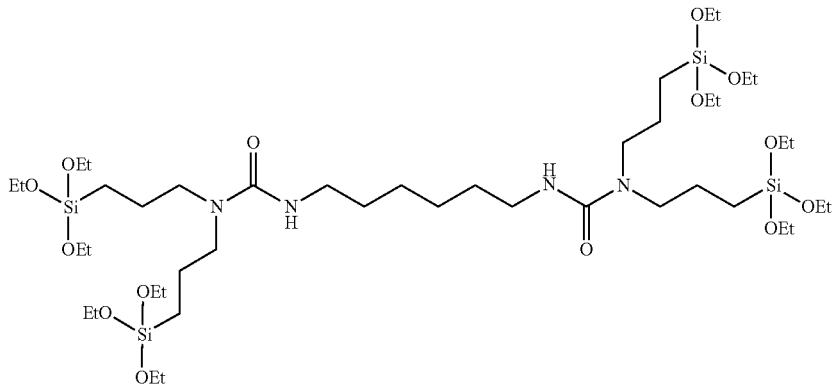 [SMILES: CCO[Si](CCCN(CCC[Si](OCC)(OCC)OCC)C(=O)NCCCCCCNC(=O)N(CCC[Si](OCC)(OCC)OCC)CCC[Si](OCC)(OCC)OCC)(OCC)OCC]
MULTISIL-7

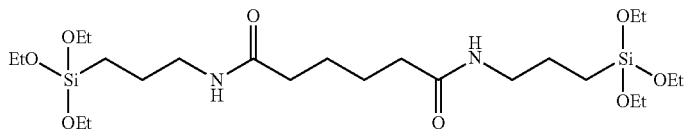 [SMILES: CCO[Si](CCCNC(=O)CCCCC(=O)NCCC[Si](OCC)(OCC)OCC)(OCC)OCC]
MULTISIL-8

Particularly preferred di- or multifunctional alkoxysilanes are poly(urethane silane) hybrid crosslinkers as disclosed in European Coating Journal, 2014 (7/8), 21-25).

Such compounds are commercially available as the VESTANAT® EP-MF product range from Evonik.

The amount of the di- or multifunctional alkoxysilane compound is preferably between 0.1 and 10 wt %, more preferably between 0.5 and 7.5 wt %, most preferably between 1 and 5 wt %, all relative to the total weight of the inkjet ink.

Photoinitiators

The radiation curable inkjet ink includes a photoinitiator, preferably a free radical photoinitiator.

A free radical photoinitiator is a chemical compound that initiates polymerization of monomers and oligomers when exposed to actinic radiation by the formation of a free radical. A Norrish Type I initiator is an initiator which cleaves after excitation, yielding the initiating radical immediately. A Norrish type II-initiator is a photoinitiator which is activated by actinic radiation and forms free radicals by hydrogen abstraction from a second compound that becomes the actual initiating free radical. This second compound is called a polymerization synergist or co-initiator. Both type I and type II photoinitiators can be used in the present invention, alone or in combination.

Suitable photoinitiators are disclosed in CRIVELLO, J. V., et al. Photoinitiators for Free Radical, Cationic and Anionic Photopolymerization. 2nd edition. Edited by BRADLEY, G. London, UK: John Wiley and Sons Ltd, 1998. p. 276-293.

Specific examples of free radical photoinitiators may include, but are not limited to, the following compounds or combinations thereof: benzophenone and substituted benzophenones; 1-hydroxycyclohexyl phenyl ketone; thioxanthones such as isopropylthioxanthone; 2-hydroxy-2-methyl-1-phenylpropan-1-one; 2-benzyl-2-dimethylamino-(4-morpholinophenyl) butan-1-one; benzyl dimethylketal; 2-methyl-1-[4-(methylthio)phenyl]-2-morpholinopropan-1-one; 2,2-dimethoxy-1, 2-diphenylethan-1-one or 5,7-diiodo-3-butoxy-6-fluorone.

A preferred photoinitiator is an acylphosphine oxide compound. The acylphosphine oxide compound may be selected from the group consisting of a mono-acylphosphine oxide and a di-acylphosphine oxide. Preferred acylphosphine oxide photoinitiators are diphenyl(2,4,6-trimethylbenzoyl) phosphine oxide (TPO), ethyl (2,4,6-trimethylbenzoyl) phenyl phosphinate (TPO-L), phenylbis(2,4,6-trimethylbenzoyl) phosphine oxide) (BAPO), bis(2,6-dimethyl-benzoyl)-2,4,4-trimethylpentylphosphine oxide and 2,4,6-trimethoxybenzoyl-diphenylphosphine oxide.

Other preferred photoinitiators are α-hydroxy-ketone Type I photoinitiators such as for example oligo[2-hydroxy-2-methyl-1-[4-(1-methylvinyl-phenyl]propanone] available as Esacure® KIP IT from IGM resins.

To prevent yellowing of the cured inkjet ink, the radiation curable inkjet ink is preferably substantially thioxanthone free. Substantially thioxanthone free referred to herein means that the radiation curable inkjet ink preferably comprises less than 0.5 wt % of thioxanthone, more preferably less than 0.2 wt % of thioxanthone, relative to the total weight of the radiation curable ink jet ink. In a most preferred embodiment, the radiation curable ink jet ink according to the present invention does not contain any thioxanthone.

A preferred amount of photoinitiator is from 0.2 up to 20 wt %, more preferably from 0.5 up to 10 wt %, most preferably from 1 up to 8 wt %, particularly preferred from 1.5 up to 6 wt %, all relative to the total weight of the radiation curable inkjet ink.

In order to increase the photosensitivity further, the radiation curable inkjet ink may additionally contain co-initiators. Suitable examples of co-initiators can be categorized in three groups:
(1) tertiary aliphatic amines such as methyldiethanolamine, dimethylethanolamine, triethanolamine, triethylamine and N-methylmorpholine;
(2) aromatic amines such as amylparadimethyl-aminobenzoate, 2-n-butoxyethyl-4-(dimethylamino) benzoate, 2-(dimethylamino)-ethylbenzoate, ethyl-4-(dimethyl-amino) benzoate, and 2-ethylhexyl-4-(dimethylamino)benzoate; and
(3) (meth)acrylated amines such as dialkylamino alkyl (meth)acrylates (e.g., diethyl-aminoethylacrylate) or N-morpholinoalkyl-(meth)acrylates (e.g., N-morpholinoethyl-acrylate).

Preferred co-initiators are aminobenzoates.

A preferred low molecular aminobenzoate is Genocure® EPD from RAHN.

Particularly preferred aminobenzoate co-initiators are selected from the group consisting of polymerisable, oligomeric and polymeric aminobenzoate co-initiators.

Polymerisable co-initiators are disclosed in EP-A 2033949 (Agfa Graphics N.V.).

In a more preferred embodiment, the aminobenzoate co-initiators are oligomeric aminobenzoate derivatives.

Particularly preferred aminobenzoates are polyether derivatives of aminobenzoates, wherein the polyether is selected from the group consisting of poly(ethylene oxide), poly(propylene oxide), copolymers thereof, and poly(tetrahydrofuran), ethoxylated or propoxylated neopentyl glycol, ethoxylated or propoxylated trimethylpropane and ethoxylated or propoxylated pentaerythritol.

Preferred oligomeric aminobenzoates are disclosed in WO1996/33157 (Lambson Fine Chemicals Ltd.) and WO2011/030089 (Sun Chemicals B.V.). Typical examples of polyethylene glycol bis p-dimethylaminobenzoate are OMNIPOL ASA, commercially available from IGM Resins and Speedcure 7040, commercially available from Lambson Fine Chemicals.

Other oligomeric or polymeric co-initiators are for example ESACURE A198, a polyfunctional amine from IGM and SARTOMER® CN3755, an acrylated amine co-initiator from ARKEMA.

Polymerizable Compounds

The polymerizable compounds are preferably free radical polymerizable compounds.

The free radical polymerizable compounds may be monomers, oligomers and/or prepolymers. Monomers are also referred to as diluents.

These monomers, oligomers and/or prepolymers may possess different degrees of functionality, i.e. a different amount of free radical polymerizable groups.

A mixture including combinations of mono-, di-, tri- and higher functional monomers, oligomers and/or prepolymers may be used. The viscosity of the radiation curable inkjet ink may be adjusted by varying the ratio between the monomers and oligomers.

In a preferred embodiment, the monomer, oligomer or polymer includes at least one acrylate group as polymerizable group.

Preferred monomers and oligomers are those listed in paragraphs to in EP-A 1911814.

In a preferred embodiment, the radiation curable inkjet ink comprises a monomer containing a vinyl ether group and an acrylate or methacrylate group. Such monomers are disclosed in EP-A 2848659, paragraphs [0099] to [0104]). A particular preferred monomer containing a vinyl ether group and an acrylate group is 2-(2-vinyloxyethoxy)ethyl acrylate.

The polymerizable compound is preferably selected from the group consisting of acryloyl morpholine, cyclic trimethyl propane formol acrylate, isobornyl acrylate, lauryl acrylate, dipropylene glycol diacrylate, trimethylol propane triacrylate, 2-(vinylethoxy)ethyl acrylate and urethane acrylate.

The radiation curable ink jet according to the present invention preferably comprises a di- or multifunctional ethoxylated acrylate having at least an ethoxylation degree of at least 0.5, more preferably at least 0.8 compared to the total degree of alkoxylation.

In an even more preferred embodiment, the ethoxylated acrylate comprises no alkoxylene moieties other than ethylene oxide moieties.

The ethoxylation degree is defined as the molar ratio of ethylene oxide moieties over the sum of all alkoxylene moieties, including e.g. propylene oxide moieties.

Polyethylene glycol diacrylates are particularly preferred. In the most preferred embodiment, said polyethylene glycol diacrylate is derived from a polyethylene glycol having 3 to 40 ethylene oxide monomer units, more preferably 3 to 30 monomer units and most preferably 4 to 20 monomer units.

Colorants

The UV free radical curable inkjet ink according to the invention preferably includes at least one colorant, more preferably a colour pigment.

The colour pigments may be black, cyan, magenta, yellow, red, orange, violet, blue, green, brown, mixtures thereof, and the like. A colour pigment may be chosen from those disclosed by HERBST, Willy, et al. Industrial Organic Pigments, Production, Properties, Applications. 3rd edition. Wiley-VCH, 2004. ISBN 3527305769.

However, most preferably the UV free radical curable inkjet ink includes a colorant selected from the group consisting of a white pigment, a yellow pigment and a black pigment. It was observed that the component legend markings on a generally green coloured protective cover layer is best legible when using a white, yellow or black colour, especially a white colour. For this reason, the UV free radical curable inkjet ink preferably includes a titanium dioxide pigment as white pigment.

Particularly preferred pigments for yellow inkjet inks are C.I Pigment Yellow 151, C.I. Pigment Yellow 180 and C.I. Pigment Yellow 74, and mixed crystals thereof.

For a black inkjet ink, suitable pigment materials include carbon blacks such as Regal™ 400R, Mogul™ L, Elftex™ 320 from Cabot Co., or Carbon Black FW18, Special Black™ 250, Special Black™ 350, Special Black™ 550, Printex™ 25, Printex™ 35, Printex™ 55, Printex™ 90, Printex™ 150T from DEGUSSA Co., MA8 from MITSUBISHI CHEMICAL Co., and C.I. Pigment Black 7 and C.I. Pigment Black 11.

For a black inkjet ink, preferably a combination of a carbon black pigment and at least one pigment selected from the group consisting of a blue pigment, a cyan pigment, a magenta pigment and a red pigment is used. It was found that the legibility of component legend markings on a PCB were further improved using such a black inkjet ink. In a particularly preferred embodiment of such a black inkjet ink, a pigment is selected from the group consisting of C.I. Pigment Blue 15:3, C.I. Pigment Blue 15:4, a diketopyrrolo pyrrole pigment (e.g. C.I Pigment Red 254), a quinacridone pigment (e.g. C.I. Pigment Violet 19, C.I. Pigment Red 202, and C.I. Pigment Red 122), and mixed crystals of quinacridone pigments and/or diketopyrrolo pyrrole pigments.

The pigment particles in the inkjet ink should be sufficiently small to permit free flow of the ink through the inkjet printing device, especially at the ejecting nozzles. It is also desirable to use small particles for maximum colour strength and to slow down sedimentation.

The average particle size of the pigment in the inkjet ink should be between 0.02 μm and 3 μm. Preferably the average pigment particle size is between 0.05 and 1 μm, more preferably between 0.070 and 0.300 μm, particularly preferably between 0.80 and 0.200 μm and most preferably between 0.090 and 0.150 μm.

The pigment is used in the inkjet ink in an amount of 0.1 to 20 wt %, preferably 1 to 10 wt %, and most preferably 2 to 6 wt % based on the total weight of the pigmented inkjet ink.

A white inkjet ink preferably includes a pigment with a high refractive index, preferably a refractive index greater than 1.60, preferably greater than 2.00, more preferably greater than 2.50 and most preferably greater than 2.60. Such white pigments generally have a very high covering power, i.e. a limited amount of white ink is necessary to hide the colour and defects of the core layer. The most preferred white pigment is titanium dioxide.

The white inkjet ink preferably contains the white pigment in an amount of 5 wt % to 30 wt %, more preferably 8 to 25 wt % of white pigment based upon the total weight of the white inkjet ink.

The numeric average particle diameter of the white pigment is preferably from 150 to 500 nm, more preferably from 200 to 400 nm, and most preferably from 250 to 350 nm. Sufficient hiding power cannot be obtained when the average diameter is less than 150 nm, and the storage ability and the jet-out suitability of the ink tend to be degraded when the average diameter exceeds 500 nm.

Polymeric Dispersants

If the colorant in the radiation curable inkjet is a pigment, then the radiation curable inkjet preferably contains a dispersant, more preferably a polymeric dispersant, for dispersing the pigment.

Suitable polymeric dispersants are copolymers of two monomers but they may contain three, four, five or even more monomers. The properties of polymeric dispersants depend on both the nature of the monomers and their distribution in the polymer. Copolymeric dispersants preferably have the following polymer compositions:

- statistically polymerized monomers (e.g. monomers A and B polymerized into ABBAABAB);
- alternating polymerized monomers (e.g. monomers A and B polymerized into ABABABAB);
- gradient (tapered) polymerized monomers (e.g. monomers A and B polymerized into AAABAABBABBB);
- block copolymers (e.g. monomers A and B polymerized into AAAAABBBBBB) wherein the block length of each of the blocks (2, 3, 4, 5 or even more) is important for the dispersion capability of the polymeric dispersant;
- graft copolymers (graft copolymers consist of a polymeric backbone with polymeric side chains attached to the backbone); and
- mixed forms of these polymers, e.g. blocky gradient copolymers.

Suitable polymeric dispersants are listed in the section on "Dispersants", more specifically to and to [0077], in EP-A 1911814.

Commercial examples of polymeric dispersants are the following:

- DISPERBYK™ dispersants available from BYK CHEMIE GMBH;
- SOLSPERSE™ dispersants available from NOVEON;
- TEGO™ DISPERST dispersants from EVONIK;
- EDAPLANT dispersants from MUNZING CHEMIE;
- ETHACRYL™ dispersants from LYONDELL;
- GANEXT dispersants from ISP;
- DISPEX™ and EFKAT dispersants from CIBA SPECIALTY CHEMICALS INC;
- DISPONER™ dispersants from DEUCHEM; and
- JONCRYL™ dispersants from JOHNSON POLYMER.

Polymerization Inhibitors

The radiation curable inkjet ink may contain at least one inhibitor for improving the thermal stability of the ink.

Suitable polymerization inhibitors include phenol type antioxidants, hindered amine light stabilizers, phosphor type antioxidants, hydroquinone monomethyl ether commonly used in (meth)acrylate monomers, and hydroquinone, t-butyl-catechol, pyrogallol, 2,6-di-tert.butyl-4-methylphenol (=BHT) may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™18 and Genorad™ 20 from Rahn AG; Irgastab™UV10 and Irgastab™ UV22, Tinuvin™ 460 and CGS20 from Ciba Specialty Chemicals; Floorstab™ UV range (UV-1, UV-2, UV-5 and UV-8) from Kromachem Ltd, Additol™ S range (S100, S110, S120 and S130) from Cytec Surface Specialties.

Since excessive addition of these polymerization inhibitors may lower the curing speed, it is preferred that the amount capable of preventing polymerization is determined prior to blending. The amount of a polymerization inhibitor is preferably lower than 5 wt %, more preferably lower than 3 wt % of the total radiation curable inkjet ink.

Surfactants

The radiation curable inkjet ink may contain at least one surfactant.

The surfactant can be anionic, cationic, non-ionic, or zwitter-ionic and is usually added in a total quantity less than 1 wt % based on the total weight of the radiation curable inkjet ink.

Suitable surfactants include fluorinated surfactants, fatty acid salts, ester salts of a higher alcohol, alkylbenzene sulfonate salts, sulfosuccinate ester salts and phosphate ester salts of a higher alcohol (for example, sodium dodecylbenzenesulfonate and sodium dioctylsulfosuccinate), ethylene oxide adducts of a higher alcohol, ethylene oxide adducts of an alkylphenol, ethylene oxide adducts of a polyhydric alcohol fatty acid ester, and acetylene glycol and ethylene oxide adducts thereof (for example, polyoxyethylene nonylphenyl ether, and SURFYNOL™ 104, 104H, 440, 465 and TG available from AIR PRODUCTS & CHEMICALS INC.).

Preferred surfactants are selected from fluoric surfactants (such as fluorinated hydrocarbons) and silicone surfactants. The silicone surfactants are preferably siloxanes and can be alkoxylated, polyether modified, polyether modified hydroxy functional, amine modified, epoxy modified and other modifications or combinations thereof. Preferred siloxanes are polymeric, for example polydimethylsiloxanes.

Preferred commercial silicone surfactants include BYK™ 333 and BYK™ UV3510 from BYK Chemie.

In a preferred embodiment, the surfactant is a polymerizable compound.

Preferred polymerizable silicone surfactants include a (meth)acrylated silicone surfactant. Most preferably the (meth)acrylated silicone surfactant is an acrylated silicone surfactant, because acrylates are more reactive than methacrylates.

In a preferred embodiment, the (meth)acrylated silicone surfactant is a polyether modified (meth)acrylated polydimethylsiloxane or a polyester modified (meth)acrylated polydimethylsiloxane.

Preferably the surfactant is present in the radiation curable inkjet ink in an amount of 0 to 3 wt % based on the total weight of the radiation curable inkjet ink.

Flame Retardant

The radiation curable inkjet ink preferably comprises a flame retardant.

Preferred flame retardants are inorganic flame retardants, such as Alumina Trihydrate and Boehmite, and organophosphor compounds, such as organo-phosphates (e.g. triphenyl phosphate (TPP), resorcinol bis(diphenylphosphate) (RDP), bisphenol A diphenyl phosphate (BADP), and tricresyl phosphate (TCP)); organo-phosphonates (e.g. dimethyl methylphosphonate (DMMP)); and organophosphinates (e.g. aluminium dimethylphosphinate).

Other preferred organo-phosphor compounds are disclosed in U.S. Pat. No. 8,273,805 (JNC Corporation)) and EP-A 3498788 (Agfa Gevaert).

Preparation of Inkjet Inks

The preparation of pigmented radiation curable inkjet inks is well-known to the skilled person. Preferred methods of preparation are disclosed in paragraphs to of WO2011/069943.

Method of Manufacturing a Printed Circuit Board

The method of manufacturing a Printed Circuit Board (PCB) according to the present invention includes at least one inkjet printing step wherein a radiation curable inkjet ink as described above is jetted and cured on a substrate.

According to a preferred embodiment, the method of manufacturing a PCB comprises an inkjet printing step wherein a legend ink is provided.

The legend ink is provided by jetting and curing the radiation curable inkjet ink typically on a solder mask. In the manufacturing of flexible PCB, the legend ink is typically provided on both a solder mask and a cover layer. The cover layers used are preferably polyimide based.

A heat treatment, also referred to as thermal treatment, is preferably applied to the jetted and cured radiation curable inkjet ink. The heat treatment is preferably carried out at a temperature between 80° C. and 250° C. The temperature is preferably not less than 100° C., more preferably not less than 120° C. To prevent charring of the solder mask, the temperature is preferably not greater than 200° C., more preferably not greater than 160° C.

The heat treatment is typically carried out between 15 and 90 minutes.

The purpose of the thermal treatment is to further increase the polymerization degree of the solder mask.

The radiation curable inkjet ink may be cured by exposing the ink to actinic radiation, such as electron beam or ultraviolet (UV) radiation. Preferably the radiation curable inkjet ink is cured by UV radiation, more preferably using UV LED curing.

The method of manufacturing a PCB may comprise two, three or more inkjet printing steps. For example the method may comprise two inkjet printing steps wherein a solder mask is provided on a dielectric substrate containing an electrically conductive pattern and wherein a legend ink is provided in another inkjet printing step. A third inkjet printing step may be used for etch resist printing.

Substrates

For the manufacturing of flexible PCBs, the substrate is preferably selected from the group consisting of a polyimide substrate, a polyether ether ketone (PEEK) substrate and a polyester substrate. Most preferably the substrate is a polyimide substrate. These substrates may be used for both the substrate carrying the conductive pattern as well as a protective cover layer.

A particularly preferred substrate is a polyimide substrate based on pyromellitic dianhydride and diaminophenyl ether, especially when a high temperature resistance is necessary, such as in a soldering process.

Commercially available polyimide substrates are Kapton™ series from DUPONT and Apical™ series from KANEKA.

In a preferred embodiment of the manufacturing method, the substrate is given a corona treatment before the inkjet printing step, for example as disclosed in EP-A 3119170, paragraph [0031].

Inkjet Printing Devices

The radiation curable inkjet ink may be jetted by one or more print heads ejecting small droplets in a controlled manner through nozzles onto a substrate, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as a continuous type.

The inkjet print head normally scans back and forth in a transversal direction across the moving ink-receiving surface (substrate). Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the ink-receiving surface. In a single pass printing process the inkjet print heads usually remain stationary and the ink-receiving surface is transported under the inkjet print heads.

Curing Devices

The radiation curable inkjet ink can be cured by exposing them to actinic radiation, such as electron beam or ultraviolet radiation. Preferably the radiation curable inkjet ink is cured by ultraviolet radiation, more preferably using UV LED curing.

In inkjet printing, the curing means may be arranged in combination with the print head of the inkjet printer, travelling therewith so that the curable liquid is exposed to curing radiation very shortly after been jetted.

In such an arrangement, with the exception of UV LEDs, it can be difficult to provide a small enough radiation source connected to and travelling with the print head. Therefore, a static fixed radiation source may be employed, e.g. a source of curing UV-light, connected to the radiation source by means of flexible radiation conductive means such as a fibre optic bundle or an internally reflective flexible tube.

Alternatively, the actinic radiation may be supplied from a fixed source to the radiation head by an arrangement of mirrors including a mirror upon the radiation head.

The source of radiation may also be an elongated radiation source extending transversely across the substrate to be cured. It may be adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as, a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:
UV-A: 400 nm to 320 nm
UV-B: 320 nm to 290 nm
UV-C: 290 nm to 100 nm.

In a preferred embodiment, the radiation curable inkjet ink is cured by UV LEDs. The inkjet printing device preferably contains one or more UV LEDs preferably with a wavelength larger than 360 nm, preferably one or more UV LEDs with a wavelength larger than 380 nm, and most preferably UV LEDs with a wavelength of about 395 nm.

Furthermore, it is possible to cure the ink image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printing device often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

Heating Devices

The inkjet printer may contain a thermal curing device for improving adhesion by giving a thermal treatment, alternatively the heat treatment may be given off-line.

The heating device may be a heat convection device like an oven, an infrared radiation source as described here below, or may be a heat conduction device, such as a hot plate or a heat drum. A preferred heat drum is an induction heat drum.

A preferred thermal curing device uses Carbon Infrared Radiation (CIR) to heat the outside of the substrate quickly. Another preferred thermal curing device is a NIR source emitting near infrared radiation. NIR-radiation energy quickly enters into the depth of the inkjet ink layer, while conventional infrared and thermo-air energy predominantly is absorbed at the surface and slowly conducted into the ink layer.

The thermal curing device may be, at least in part, arranged in combination with the print head of the inkjet printer, travelling therewith so that the curing radiation is applied very shortly after jetting together or after UV irradiation. In such a case, the inkjet printer is preferably equipped with some kind of infrared radiation source, e.g. an infrared light source, such as an infrared laser, one or more infrared laser diodes or infrared LEDs.

A preferred effective infrared radiation source has an emission maximum between 0.8 and 1.5 µm. Such an infrared radiation source is sometimes called a NIR radiation source or NIR dryer. In a preferred form the NIR radiation source is in the form of NIR LEDs, which can be mounted easily on a shuttling system of a plurality of inkjet print heads in a multi-pass inkjet printing device.

In a more preferred form the NIR radiation source is mounted downstream of single pass inkjet printing device.

EXAMPLES

Materials

All materials used in the following examples were readily available from standard sources such as ALDRICH CHEMICAL Co. (Belgium) and ACROS (Belgium) unless otherwise specified. The water used was deionized water.

Kemira™ RDI-S is a alumina surface treated rutile titanium dioxide pigment available from KEMIRA.

DB162 is an abbreviation used for the polymeric dispersant Disperbyk™ 162 available from BYK CHEMIE whereof the solvent mixture of 2-methoxy-1-methylethylacetate, xylene and n-butylacetate was removed.

VEEA is 2-(vinylethoxy)ethyl acrylate available from NIPPON SHOKUBAI, Japan

INHIB is a mixture forming a polymerization inhibitor having a composition according to Table 3.

TABLE 3

| Component | wt % |
| --- | --- |
| DPGDA | 82.4 |
| p-methoxyphenol | 4.0 |
| 2,6-di-tert-butyl-4-methylphenol | 10.0 |
| Cupferron ™ AL | 3.6 |

Cupferron™ AL is aluminum N-nitrosophenylhydroxylamine from WAKO CHEMICALS LTD.

DISP-W is a white pigment dispersion having a composition according to Table 4 and prepared as follows:

TABLE 4

| Component | wt % |
| --- | --- |
| KemiraTM RDI-S | 50.0 |
| DB162 | 4.0 |
| INHIB | 1.0 |
| VEEA | 45.0 |

The concentrated white pigment dispersion DISP-W was made by mixing in VEEA as liquid medium, 1500 g of the white pigment Kemira™ RDI-S, 30 g of the inhibitor INHIB and 400 g of a 30% solution of the polymeric dispersant DB162 in VEEA for 30 minutes in a vessel equipped with a DISPERLUX™ disperser (from DISPERLUX S.A.R.L., Luxembourg). This mixture was subsequently milled in a DYNO™-MILL KD MULTILAB from the company WAB Willy A. Bachofen (Switzerland) using 0.40 mm yttrium-stabilized zirconium oxide-beads. The bead mill was filled for 50% with the grinding beads and operated in recirculation mode for 30 minutes by using a tip speed of 8 m/s. The milling chamber was water-cooled during the operation. The average particles size was 232 nm.

TMPTA is trimethylolpropane triacrylate available as Sartomer™ SR351 from ARKEMA Photomer 6210 is an urethane acrylate oligomer supplied by IGM SR335 is lauryl acrylate supplied by Arkema Ebecryl 1360 is a polysiloxane hexaacrylate supplied by Allnex BAPO is a bis(2,4,6-trimethylbenzoyl)-phenylphosphineoxide photoinitiator available as Irgacure™ 819 from BASF TPO-L is ethyl phenyl(2,4,6-trimethylbenzoyl)phosphinate available as Omnirad™ TPO-L from IGM Resins BV Esacure KIP IT is an oligomeric α-hydroxy-ketone photoinitiator supplied by IGM.

Z6040 is 3-glycidoxypropyltrimethoxy, available as Silane Z-6040 from DOW CORNING MULTISIL-9 is a di-functional alkoxysilane available as Vestanat® EP-MF-204 from EVONIK PEG-200 is a polyethylene glycol 200 diacrylate, commercially available as SR259 from ARKEMA PEG-300 is a polyethylene glycol 300 diacrylate, commercially available as Miramer M284 from MIWON.

PEG-400 is a polyethylene glycol 400 diacrylate, commercially available as SR344 from ARKEMA.

PEG-600 is a polyethylene glycol 600 diacrylate, commercially available as Miramer M286 from MIWON.

Reaxis C709 is a bismuth-zinc neodecanoate catalyst supplied by WILL&Co.

DPGDA is dipropylenediacrylate, available as Sartomer SR508 from ARKEMA.

MULTISIL-2 was prepared as follows:

temperature for 24 hours. The solvent was removed under reduced pressure and the residue was used in the formulation of the inks according to the present invention without further purification.

The structure of MULTISIL-2 was confirmed by 1H-NMR spectroscopy. The following compound was identified as contaminant at 8 wt % compared to MULTISIL-2.

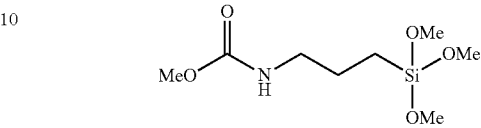

MULTISIL-4 was prepared as follows:

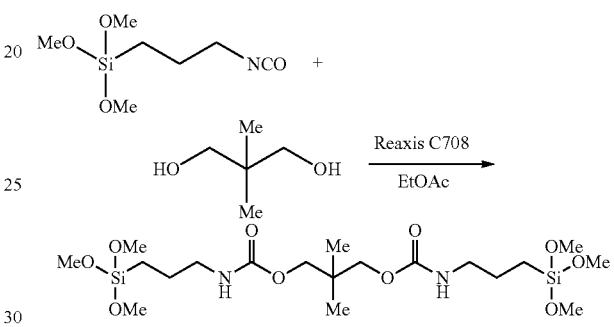

5.26 g ((50 mmol) neopentyl glycol was dissolved in 30 g ethyl acetate. 0.137 g Reaxis C708 was added followed by the dropwise addition of 22.69 g (105 mmol) (3-isocyanatopropyl) trimethoxy silane, leading to a temperature increase to 48° C. The reaction was allowed to continue at room temperature for 72 hours. The solvent was removed under reduced pressure and the residue was diluted with 2-(vinyl-

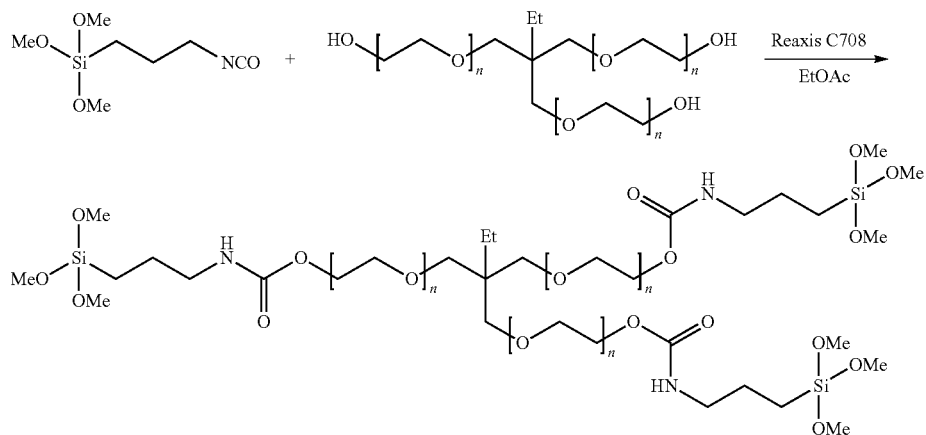

10 g (22.7 mmol) Polyol 3380 (ethoxylated trimethylol propane, KOH content 0.380 g KOH/g) was dissolved in 30 g ethyl acetate. 0.055 g Reaxis C708 was added followed by the dropwise addition of 15.13 g (70 mmol) (3-isocyanatopropyl) trimethoxy silane, leading to a temperature increase to 42° C. The reaction was allowed to continue at room lethoxy)ethyl acrylate to obtain a 60 wt % solution of MULTISIL-4 in 2-(vinylethoxy)ethyl acrylate. The solution was used to formulate the inks according to the present invention. The structure of MULTISIL-4 was confirmed by 1H-NMR spectroscopy. The following compound was identified as contaminant at 7 wt % compared to MULTISIL-4.

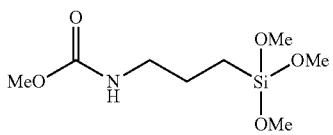 [SMILES: COC(=O)NCCC[Si](OC)(OC)OC]

MULTISIL-10 to MULTISIL-12 were prepared as follows:

X g of 3-(trimethoxysilyl) propyl-methacrylate was dissolved in 40 g ethyl acetate. Y g dodecyl-thiol was added and the mixture was flushed with nitrogen. The mixture was heated to 70° C. and a solution Z mg WAKO V59 dissolved in 5 g ethyl acetate was added in one portion. The mixture was heated to reflux and the polymerization was allowed to continue for 16 hours at reflux. The polymerization proved to be complete based on TLC analysis. No residual monomer was detectable (TLC analysis on Reveleris RP C18 TLC plates, supplied by Grace, eluent: methanol/methylene chloride: 70/30, Rf of 3-(trimethoxysilyl) propyl-methacrylate: 0.27). The mixture was allowed to cool down to room temperature and the solvent was removed under reduced pressure. The polymers were diluted with 2-(vinylethoxy) ethyl acrylate to obtain a 60 wt % solution of the different polymers in 2-(vinylethoxy)ethyl acrylate.

TABLE 5

|  | X (g) | Y (g) | Z (mg) |
|---|---|---|---|
| MULTISIL-10 | 24.8 | 1.1 | 18 |
| MULTISIL-11 | 24.8 | 2.3 | 18 |
| MULTISIL-12 | 24.8 | 3.65 | 18 |

Apical™ 200NP is a polyimide substrate from KANEKA.
Apical™ 200AV is a thermoset polyimide substrate from KANEKA.
SF305C is a polyimide based cover layer from SHENGYI TECHNOLOGIES.
SF308C is a polyimide based cover layer from SHENGYI TECHNOLOGIES.
GP 25.25 is a polyimide based cover layer from WANDA.
GA 12.13 is a polyimide based cover layer from WANDA.
BLT0517 is a polyimide based cover layer from Shandong Brilliant Materials.

Methods

Viscosity

The viscosity of the inks was measured at 45° C. and at a shear rate of 1000 s$^{-1}$ using a "Robotic Viscometer Type VISCObot" from CAMBRIDGE APPLIED SYSTEMS.

For industrial inkjet printing, the viscosity at 45° C. and at a shear rate of 1000 s$^{-1}$ is preferably between 5.0 and 15 mPa·s. More preferably the viscosity at 45° C. and at a shear rate of 1 000 s$^{-1}$ is less than 15 mPa·s.

Adhesion of the Inkjet Inks

The adhesion was evaluated according to the ISO2409: 1992 Paints and varnishes cross-cut test (International standard 1992 Aug. 15) using a Braive No. 1536 Cross Cut Tester from BRAIVE INSTRUMENTS with a spacing of a 1 mm between cuts in combination with a Tesatape™ 4104 PVC tape.

The evaluation was made in accordance with a criterion described in Table 6, where both the adhesion in the cross-cut and outside the cross-cut were evaluated.

TABLE 6

| Evaluation value | Criterion |
|---|---|
| 0 | Nothing removed, perfect adhesion. |
| 1 | Detachment of only very small parts of the cured layer, almost perfect adhesion. |
| 2 | Minor parts of the cured layer was removed by the tape, good adhesion |
| 3 | Parts of the cured layer were removed by the tape, poor adhesion. |
| 4 | Most of the cured layer was removed by the tape, poor adhesion. |
| 5 | The cured layer was completely removed from the substrate by the tape, no adhesion. |

Example 1

Preparation of Comparative Inks COMP-1 to COMP-7 and Inventive Inks INV-1 to INV-6

The comparative radiation curable inkjet ink COMP-1 to COMP-7 and the inventive radiation curable inkjet inks INV-1 to INV-6 were prepared according to Table 7. The weight percentages (wt %) are all based on the total weight of the radiation curable inkjet ink.

TABLE 7

| wt % of component | COMP-1 | COMP-2 | COMP-3 | COMP-4 | COMP-5 |
|---|---|---|---|---|---|
| DISP-1 | 26.0 | = | = | = | = |
| VEEA | 25.0 | = | 23.0 | = | = |
| TMPTA | 7.5 | = | = | = | = |
| Photomer 6210 | 15.0 | = | = | = | = |
| SR335 | 15.0 | = | = | = | = |
| BAPO | 2.5 | = | = | = | = |
| TPO-L | 2.5 | = | = | = | = |
| Esakure KIP IT | 2.5 | = | = | = | = |
| MONOSIL-1 | 3.0 | — | — | — | — |
| MULTISIL-9 | — | 3.0 | — | — | — |
| MULTISIL-10 | — | — | 5.0 | — | — |
| MULTISIL-11 | — | — | — | 5.0 | — |
| MULTISIL-12 | — | — | — | — | 5.0 |
| Ebecryl 1360 | 0.2 | = | = | = | = |
| INHIB | 0.7 | = | = | = | = |

| wt % of component | COMP-6 | COMP-7 | INV-1 | INV-2 | INV-3 |
|---|---|---|---|---|---|
| DISP-1 | 26.0 | = | = | = | = |
| VEEA | 23.0 | = | 23.0 | = | = |
| TMPTA | 7.5 | = | = | = | = |
| Photomer 6210 | 15.0 | = | = | = | = |
| SR335 | 15.0 | = | = | = | = |
| BAPO | 2.5 | = | = | = | = |
| TPO-L | 2.5 | = | = | = | = |
| Esakure KIP IT | 2.5 | = | = | = | = |
| MONOSIL-1 | — | — | 3.0 | = | = |
| MULTISIL-2 | 5.0 | — | — | — | — |
| MULTISIL-4 | — | 5.0 | — | — | — |
| MULTISIL-9 | — | — | 5.0 | — | — |
| MULTISIL-10 | — | — | — | 5.0 | — |
| MULTISIL-11 | — | — | — | — | 5.0 |
| Ebecryl 1360 | 0.2 | = | = | = | = |
| INHIB | 0.7 | = | = | = | = |

| wt % of component | INV-4 | INV-5 | INV-6 |
|---|---|---|---|
| DISP-1 | 26.0 | = | = |
| VEEA | 23.0 | = | 23.0 |
| TMPTA | 7.5 | = | = |
| Photomer 6210 | 15.0 | = | = |
| SR335 | 15.0 | = | = |
| BAPO | 2.5 | = | = |

TABLE 7-continued

| | | | |
|---|---|---|---|
| TPO-L | 2.5 | = | = |
| Esakure KIP IT | 2.5 | = | = |
| MONOSIL-1 | 3.0 | = | = |
| MULTISIL-12 | 5.0 | — | — |
| MULTISIL-2 | — | 5.0 | — |
| MULTISIL-4 | — | — | 5.0 |
| Ebecryl 1360 | 0.2 | = | = |
| INHIB | 0.7 | = | = |

The comparative inkjet inks COMP-1 to COMP-7 and the inventive inkjet inks INV-1 to INV-06 were jetted using a Microcraft MJP 2013 K1 (resolution 1440 by 1080 dpi, 45° C. jetting temperature, 100% pincure after each pass using a LED 395 nm lamp) on a GP 25.25 and on a SF305C cover layer. Additionally a thermal cure at 150° C. during 60 minutes was performed.

The adhesion on the GP25.25 substrate (ADH-1) and on the SF305C substrate (ADH-2) of the inks were tested as described above. The results are shown in Table 8.

TABLE 8

| UV curable ink jet ink | ADH-1 | ADH-2 |
|---|---|---|
| COMP-1 | 5 | 3 |
| COMP-2 | 5 | 3 |
| COMP-3 | 5 | 0 |
| COMP-4 | 5 | 0 |
| COMP-5 | 5 | 5 |
| COMP-6 | 5 | 5 |
| COMP-7 | 5 | 5 |
| INV-1 | 0 | 0 |
| INV-2 | 0 | 0 |
| INV-3 | 0 | 0 |
| INV-4 | 0 | 0 |
| INV-5 | 0 | 0 |
| INV-6 | 0 | 0 |

It is clear from the results of Table 8 that the inventive inkjet inks containing a combination of a di- or multifunctional alkoxysilane and a monofunctional alkoxysilane functionalized with a group selected from the group consisting of an epoxide and an oxetane have an improved adhesion.

Example 2

Preparation of Inventive Inks INV-7 to INV-10

The inventive radiation curable inkjet inks INV-7 to INV-10 were prepared according to Table 9. The weight percentages (wt %) are all based on the total weight of the radiation curable inkjet ink.

TABLE 9

| | INV-7 | INV-8 | INV-9 | INV-10 |
|---|---|---|---|---|
| DISP-1 | 26.0 | = | = | = |
| VEEA | 17.0 | = | = | = |
| TMPTA | 7.0 | = | = | = |
| Photomer 6210 | 15.0 | = | = | = |
| SR335 | 15.0 | = | = | = |
| BAPO | 2.5 | = | = | = |
| TPO-L | 2.5 | = | = | = |
| Esacure KIP IT | 2.5 | = | = | = |
| Z6040 | 3.0 | = | = | = |
| MULTISIL-9 | 3.0 | = | = | = |
| PEG-200 | 5.0 | — | — | — |

TABLE 9-continued

| | INV-7 | INV-8 | INV-9 | INV-10 |
|---|---|---|---|---|
| PEG-300 | — | 5.0 | — | — |
| PEG-400 | — | — | 5.0 | — |
| PEG-600 | — | — | — | 5.0 |
| Ebecryl 1360 | 0.2 | = | = | = |
| INHIB-1 | 0.7 | = | = | = |

The inventive inkjet inks INV-7 to INV-10 were jetting using a Microcraft MJP 2013 K1 (resolution 1440 by 1080 dpi, 45° C. jetting temperature, 100% pincure after each pass using a LED 395 nm lamp) on the substrates of Table 10. Additionally a thermal cure at 150° C. during 60 minutes was performed.

The adhesion (30 min. 150° C. thermal cure) of the inks were tested as described above. The results are shown in Table 10.

TABLE 10

| Substrate | INV-7 | INV-8 | INV-9 | INV-10 |
|---|---|---|---|---|
| Kapton 300HN | 0 | 1 | 1 | 1 |
| Apical 200NP | 1 | 1.5 | 1.5 | 1 |
| Apical 200AV | 0.5 | 1.5 | 1.5 | 1.5 |
| SF305C | 0 | 0 | 0 | 0 |
| SF308C | 0 | 0 | 0 | 0 |
| GP 25.25 | 0 | 0 | 0 | 0 |
| GA 12.13 | 0 | 0 | 0 | 0 |
| BLT0517 | 2 | 1 | 0 | 0 |

From Table 10 it becomes apparent that the legend ink according to the present invention shows excellent adhesion properties on a broad scope of polyimide based substrates.

The invention claimed is:

1. A radiation curable inkjet ink comprising a polymerizable compound and a photoinitiator characterized in that the inkjet ink further comprises a di- or multifunctional alkoxysilane and a monofunctional alkoxysilane functionalized with a group selected from the group consisting of an epoxide and an oxetane, wherein the di- or multifunctional alkoxysilane includes at least two alkoxysilane moieties according to Formula I,

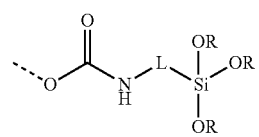

Formula I wherein
L represents a divalent linking group selected from the group consisting of a substituted or unsubstituted alkylene group, a substituted or unsubstituted alkenylene group, a substituted or unsubstituted alkynylene group, and a substituted or unsubstituted arylene group, and
R represents a group selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted aryl or heteroaryl group.

2. The radiation curable inkjet ink of claim 1, wherein L is a propylene group and R is an ethyl or methyl group.

3. The radiation curable inkjet ink of claim 1, wherein the monofunctional alkoxysilane is functionalized with an epoxide.

4. The radiation curable inkjet ink of claim 1, wherein the photoinitiator is an acylphosphine oxide compound.

5. The radiation curable inkjet ink of claim 4, wherein the inkjet ink is substantially halogen free.

6. The radiation curable inkjet ink of claim 4, wherein the inkjet ink is substantially thioxanthone free.

7. The radiation curable inkjet ink of claim 1, wherein the inkjet ink comprises a di- or multifunctional ethoxylated acrylate having an ethoxylation degree of 0.5 or more relative to the total degree of alkoxylation.

8. The radiation curable inkjet ink of claim 1, wherein the polymerizable compound is selected from the group consisting of acryloyl morpholine, cyclic trimethyl propane formal acrylate, isobornyl acrylate, dipropylene glycol diacrylate, trimethylol propane triacrylate, and 2-(vinylethoxy) ethyl acrylate.

9. A method of manufacturing a Printed Circuit Board (PCB) including an inkjet printing step wherein a radiation curable inkjet ink as defined in claim 1 is jetted and cured on a substrate.

10. The method of claim 9, wherein curing is carried out using LED UV radiation.

11. The method of claim 9, wherein the inkjet printing step includes legend printing.

12. The method of claim 9, further comprising a heating step.

13. The method of claim 9, wherein the substrate is a solder mask or a cover layer.

14. The method of claim 9, wherein the substrate is a polyimide-based substrate.

* * * * *